United States Patent
Thewes et al.

(10) Patent No.: US 6,490,192 B2
(45) Date of Patent: Dec. 3, 2002

(54) DEVICE FOR EVALUATING CELL RESISTANCES IN A MAGNETORESISTIVE MEMORY

(75) Inventors: Roland Thewes, Gröbenzell (DE); Werner Weber, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/968,575

(22) Filed: Oct. 1, 2001

(65) Prior Publication Data

US 2002/0071306 A1 Jun. 13, 2002

Related U.S. Application Data

(63) Continuation of application No. PCT/DE00/00776, filed on Mar. 13, 2000.

(30) Foreign Application Priority Data

Mar. 30, 1999 (DE) .......................... 199 14 489

(51) Int. Cl.$^7$ ............................................. G11C 11/00
(52) U.S. Cl. ............. 365/158; 365/189.07; 365/189.09; 365/191; 365/210; 365/148
(58) Field of Search ............................ 365/189.01, 158, 365/189.09, 189.07, 148, 191, 210

(56) References Cited

U.S. PATENT DOCUMENTS

| | | |
|---|---|---|
| 5,173,873 A | 12/1992 | Wu et al. |
| 5,493,533 A | 2/1996 | Lambrache |
| 5,793,697 A * | 8/1998 | Scheuerlein ............ 365/230.07 |
| 6,341,084 B2 * | 1/2002 | Numata et al. ............. 365/158 |
| 6,351,408 B1 * | 2/2002 | Schwarzl et al. ........... 365/158 |
| 2001/0026469 A1 * | 10/2001 | Schlosser et al. ........... 365/158 |
| 2001/0048608 A1 * | 12/2001 | Numata et al. ............. 365/158 |
| 2002/0006061 A1 * | 1/2002 | Poechmueller ......... 365/189.01 |
| 2002/0055016 A1 * | 5/2002 | Hiramoto et al. ........... 428/692 |

FOREIGN PATENT DOCUMENTS

EP 0383078 A1 8/1990

OTHER PUBLICATIONS

"A 36ns 1Mbit CMOS EPROM with new data sensing technique", Hiroto Nakai et al., 1990 Symposium on VLSI Circuits, Digest of Technical Papers, pp. 95 and 96.

* cited by examiner

Primary Examiner—Viet Q. Nguyen
(74) Attorney, Agent, or Firm—Laurence A. Greenberg; Werner H. Stemer; Gregory L. Mayback

(57) ABSTRACT

A magnetoresistive memory is described and contains a common word line voltage source, bit lines, word lines crossing the bit lines, and a memory cell array having memory cells with cell resistors. The memory cell array further has reference cells with reference cell resistors. The memory cell array is configured such that for testing a respective cell resistor in each case two of the reference cell resistors nearest the respective cell resistor and the reference cell are simultaneously connected to a common word line voltage. A first feedback amplifier together with the two reference cell resistors form a summing amplifier. A second feedback amplifier together with the respective cell resistor form an amplifier having an equivalent gain as the summing amplifier. A comparator is connected to the summing amplifier and the amplifier. The comparator has an output supplying an evaluation signal dependent on the respective cell resistor.

2 Claims, 1 Drawing Sheet

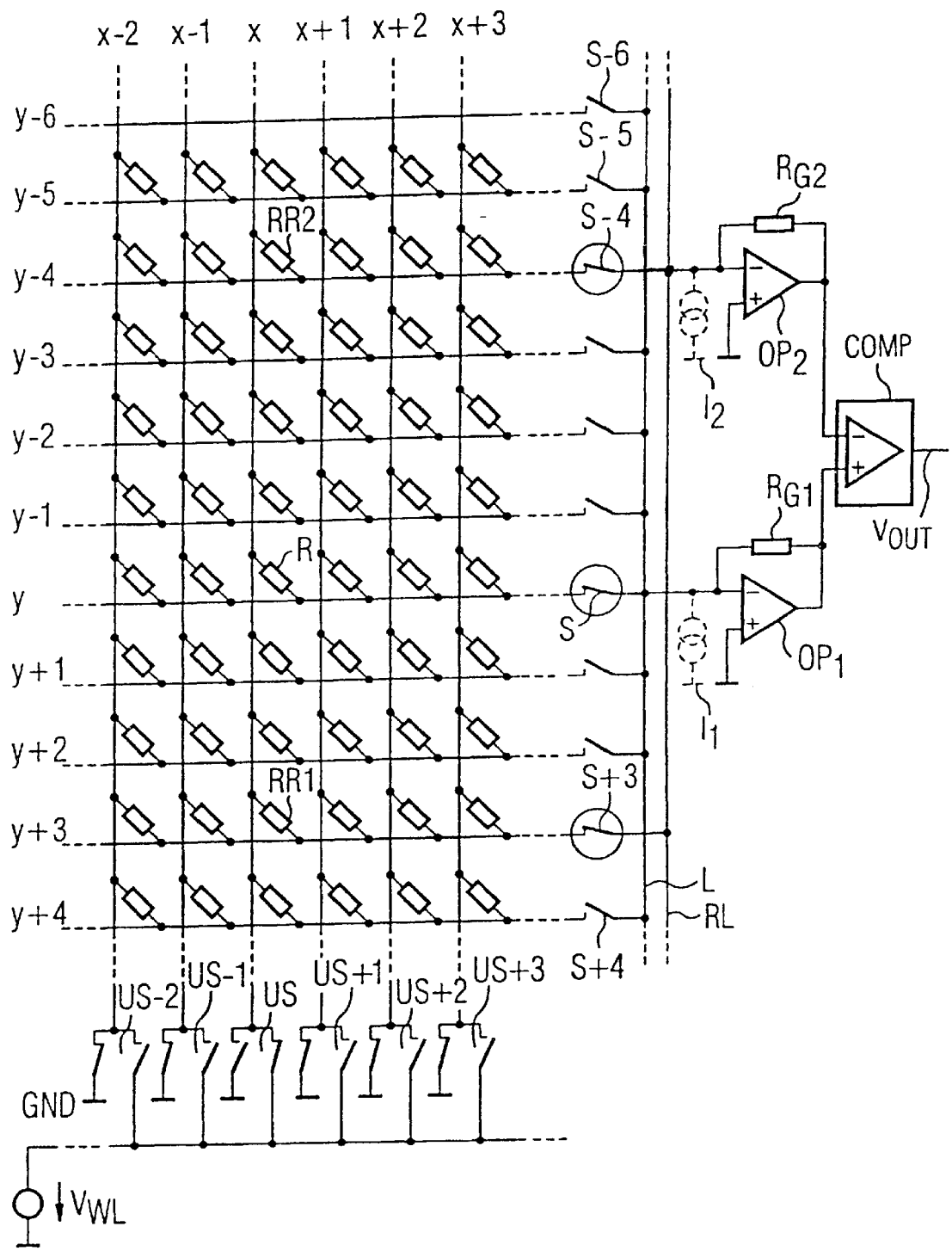

DEVICE FOR EVALUATING CELL RESISTANCES IN A MAGNETORESISTIVE MEMORY

CROSS REFERENCE TO RELATED APPLICATION

This application is a continuation of copending International Application No. PCT/DE00/00776, filed Mar. 13, 2000, which designated the United States.

BACKGROUND OF THE INVENTION

FIELD OF THE INVENTION

The invention relates to a device for evaluating a magnetically variable electrical resistance of a magnetoresistive memory cell with the aid of a reference cell. Such a memory cell typically has a soft-magnetic layer and a hard-magnetic layer, which are electrically conductive and isolated from one another by a tunnel oxide, the tunneling probability and thus the electrical resistance depends on the directions of polarization of the two layers.

Such a device is disclosed in U.S. Pat. No. 5,173,873, in particular FIG. 4, for each column only a single reference cell is used for evaluating a memory cell and an evaluation takes place rapidly and with a low power loss as a result.

On account of the fabrication tolerances, the cell resistances are not constant over the entire memory cell array and, in particular in the case of large memory cell arrays, incorrect evaluations easily occur because the relative change in resistance of a memory cell on account of a change in the stored information is only slight.

SUMMARY OF THE INVENTION

It is accordingly an object of the invention to provide a device for evaluating cell resistances in a magneto resistive memory that overcomes the above-mentioned disadvantages of the prior art device of this general type, in which maximum evaluation reliability is achieved with minimum additional outlay, in particular in the case of large MRAMs.

With the foregoing and other objects in view there is provided, in accordance with the invention, a magnetoresistive memory. The memory contains a common word line voltage source outputting a common word line voltage, bit lines, word lines crossing the bit lines, and a memory cell array having a multiplicity of memory cells with cell resistors connected to the bit lines and the word lines. The memory cell array further has a multiplicity of reference cells with reference cell resistors connected to the bit lines and the word lines. The memory cell array is configured such that for testing a respective cell resistor in each case two of the reference cell resistors nearest the respective cell resistor and the reference cell are simultaneously connected to the common word line voltage. A respective bit line connected to the respective cell resistor is connected to the common word line voltage through the respective cell resistor and correspondingly at a same time two of the bit lines each respectively connected to one of the two reference cell resistors are connected to the word line voltage through the two reference cell resistors. A first feedback amplifier together with the two reference cell resistors form a summing amplifier having an output. A second feedback amplifier together with the respective cell resistor form an amplifier having an output and an equivalent gain as the summing amplifier. A comparator is provided and has a first input connected to the output of the summing amplifier and a second input connected to the output of the amplifier. The comparator has an output supplying an evaluation signal dependent on the respective cell resistor.

The invention is based on the fact that rows with the reference cells are provided in the cell array, for example at regular intervals, and the respective cell resistor is compared with an average value formed from in each case from the two nearest reference cell resistors. One reference cell resistor in each case is used for two groups of cell resistors for the comparison.

In accordance with an added feature of the invention, a first current sink is provided, and a reference ground terminal for a reference ground potential is connected to the first current sink. The first feedback amplifier has a first feedback resistor switchably connected to the two reference cell resistors at a first connecting node. The first connecting node is connected to the reference ground terminal through the first current sink. The second feedback amplifier has a second feedback resistor with twice a value as the first feedback resistor, the second feedback resistor is switchably connected to the respective reference cell at a second connecting node. A second current sink is connected to the reference ground terminal. The second connecting node is connected to the reference ground terminal through the second current sink. The first current sink has twice a current of the second current sink and a current of the second current sink corresponds to a magnitude of the common word line voltage divided by a magnitude of the respective cell resistor.

Other features which are considered as characteristic for the invention are set forth in the appended claims.

Although the invention is illustrated and described herein as embodied in a device for evaluating the cell resistances in a magnetoresistive memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a circuit diagram of a memory cell configuration.

DESCRIPTION OF THE PREFERRED EMBODIMENTS

Referring now to the single FIGURE of the drawing, there is shown a preferred exemplary embodiment of the invention. The figure shows a matrix-type configuration of bit lines y+4 ... y ... y−6 and word lines x−2 ... x ... x+3, which represents a detail from a cell array of a magnetoresistive memory. A resistor of the magnetoresistive memory cell is present between each of the bit lines and each of the word lines. The resistor usually contains a soft-magnetic region and a hard-magnetic region which lie one above the other and are isolated by a tunnel oxide. In the cell array illustrated, by way of example, all the cell resistors connected to the bit line y+3 and all the cell resistors connected to the bit line y−4, form reference cell resistors to be compared with the rest of the cell resistors. A cell resistor R is connected between a selected word line x and a selected bit line y, and the reference cell resistors RR1 and RR2 are connected between the same word line and the two reference bit lines y+3 and y-4. The selection or the addressing of the word lines is in this case effected with the aid of changeover switches US-2 ... US+3, which are connected in order to the word lines x-2 ... x+3 and via which a word line voltage $V_{WL}$ is in each case applied to a word line, here the word line x, and reference-ground potential GND is applied to the other word lines. The bit lines functioning as reference bit lines, for example y+3 and y-4, are connected through to a common reference line RL via switches, for example S-4 and S+3, since they are nearest the addressed cell resistor R. The selected bit line y is connected to a common line L by the switch S. To ensure that not all of the cell resistors connected to the word line x but rather only the cell resistor R connected to the addressed bit line is connected through to a common line L, all the further switches, for example S-6 and S-5, connected to regular bit lines and to the common line L remain open. The reference cell resistors RR1 and RR2, together with an operational amplifier $OP_2$ having feedback via a resistor $R_{G2}$, form an inverting summing amplifier which supplies, at its output, a voltage which depends on a average value formed from the two cell resistors RR1 and RR2. The cell resistor R, together with an operational amplifier $OP_1$ having feedback via a resistor $R_{G1}$, likewise forms an inverting voltage amplifier, the feedback resistor $R_{G1}$ having twice a value of the feedback resistor $R_{G2}$ of the operational amplifier $OP_2$. Thus, a signal that can be compared with a reference signal of the summing amplifier is produced, since, after all, the current supplied via the two reference cell resistors RR1, RR2 is twice that through the single resistor R. The output voltage of the inverting summing amplifier $OP_2$ is fed to the inverting input and the output voltage of the inverting amplifier $OP_1$ is fed to the non-inverting input of a comparator COMP, an evaluation signal VOUT dependent on the respective cell resistor being present at the output of the comparator COMP. A customary comparator can advantageously be used by virtue of this circuitry.

The ratio of a number between regular bit lines and reference bit lines is to be chosen in accordance with the parameter fluctuations and the relative change in resistance, to ensure that incorrect evaluation does not occur. Here in this example, every eighth bit line represents a reference bit line.

In an advantageous refinement of the above exemplary embodiment, a first current sink $I_2$ and a second current sink $I_1$ are additionally present. One connecting node between the respective reference cell resistor and the first feedback resistor $R_{G2}$ of the summing amplifier is connected to a reference-ground potential GND via the first current sink $I_2$. A connecting node between the respective addressed cell resistor R and a second feedback resistor $R_{G1}$ of the amplifier having twice the gain is connected to reference-ground potential via the second current sink $I_1$. The first current sink $I_2$ having twice the current of the second current sink $I_1$. This measure serves for operating both operational amplifiers $OP_1$ and $OP_2$ at a favorable operating point, i.e. with a low DC offset output voltage, during the evaluation operation. For this purpose, the condition $I_1 = V_{WL}/R$ must be met, in which case, via the resistor R and the second current source $I_1$, and via the reference resistors RR1 and RR2 and the first current source $I_2$, respective currents with opposite signs must be fed into the corresponding common nodes.

We claim:

1. A magnetoresistive memory, comprising:

a common word line voltage source outputting a common word line voltage;

bit lines;

word lines crossing said bit lines;

a memory cell array having a multiplicity of memory cells with cell resistors connected to said bit lines and said word lines, said memory cell array further having a multiplicity of reference cells with reference cell resistors connected to said bit lines and said word lines, said memory cell array configured such that for testing a respective cell resistor in each case two of said reference cell resistors nearest said respective cell resistor and said reference cell are simultaneously connected to the common word line voltage, a respective bit line connected to said respective cell resistor is connected to the common word line voltage through said respective cell resistor and correspondingly at a same time two of said bit lines each respectively connected to one of said two reference cell resistors are connected to the word line voltage through said two reference cell resistors;

a first feedback amplifier together with said two reference cell resistors forming a summing amplifier having an output;

a second feedback amplifier together with said respective cell resistor forming an amplifier having an output and an equivalent gain as said summing amplifier; and a comparator having a first input connected to said output of said summing amplifier and a second input connected to said output of said amplifier, said comparator having an output supplying an evaluation signal dependent on said respective cell resistor.

2. The memory according to claim 1, including a first current sink;

including a reference ground terminal for a reference ground potential connected to said first current sink;

wherein said first feedback amplifier has a first feedback resistor switchably connected to said two reference cell resistors at a first connecting node, said first connecting node connected to said reference ground terminal through said first current sink;

wherein said second feedback amplifier has a second feedback resistor with twice a value as said first feedback resistor, said second feedback resistor switchably connected to said respective reference cell at a second connecting node;

including a second current sink connected to said reference ground terminal; and wherein said second connecting node is connected to said reference ground terminal through said second current sink, said first current sink having twice a current of said second current sink and a current of said second current sink corresponding to a magnitude of the common word line voltage divided by a magnitude of said respective cell resistor.

* * * * *